United States Patent
Preisach

(10) Patent No.: US 7,502,400 B2
(45) Date of Patent: Mar. 10, 2009

(54) DRIVE CIRCUIT AND METHOD OF OPERATING A SEMICONDUCTOR LASER

(75) Inventor: Helmut Preisach, Besigheim (DE)

(73) Assignee: Alcatel, Paris (FR)

( * ) Notice: Subject to any disclaimer, the term of this patent is extended or adjusted under 35 U.S.C. 154(b) by 716 days.

(21) Appl. No.: 10/760,397

(22) Filed: Jan. 21, 2004

(65) Prior Publication Data

US 2005/0276290 A1    Dec. 15, 2005

(30) Foreign Application Priority Data

Feb. 5, 2003    (EP)    ................... 03360020

(51) Int. Cl.
*H01S 3/00* (2006.01)
(52) U.S. Cl. ............. 372/38.02; 372/38.07; 372/29.015
(58) Field of Classification Search ............ 372/29.015, 372/30.02, 29.01, 27.04, 29.012, 29.014, 372/29.016, 29.021, 38.1–38.09, 29.011
See application file for complete search history.

(56) References Cited

U.S. PATENT DOCUMENTS

| | | | | |
|---|---|---|---|---|
| 4,612,671 A * | 9/1986 | Giles | .......................... | 398/197 |
| 5,646,763 A * | 7/1997 | Misaizu et al. | .............. | 398/197 |
| 5,883,910 A * | 3/1999 | Link | ....................... | 372/38.07 |
| 6,226,322 B1 * | 5/2001 | Mukherjee | ................... | 375/229 |
| 6,249,178 B1 * | 6/2001 | Umeda | ..................... | 327/563 |
| 6,792,019 B2 * | 9/2004 | Fattaruso | ................ | 372/38.07 |
| 2003/0043869 A1 * | 3/2003 | Vaughan | ................. | 372/38.02 |
| 2005/0025201 A1 * | 2/2005 | Schrodinger et al. | ..... | 372/38.02 |

\* cited by examiner

*Primary Examiner*—Minsun Harvey
*Assistant Examiner*—Tod T Van Roy
(74) *Attorney, Agent, or Firm*—Sughrue Mion, PLLC

(57) ABSTRACT

A circuit for driving a semiconductor laser, in particular a vertical cavity surface-emitting laser that comprises a differential amplifier for driving the semiconductor laser directly. The semiconductor laser is differentially driven by means of the differential amplifier, a first output of the differential amplifier being direct-current-coupled to a first terminal of the semiconductor laser and a second output of the differential amplifier being alternating-current-coupled to a second terminal of the semiconductor laser.

11 Claims, 2 Drawing Sheets

DRIVE CIRCUIT AND METHOD OF OPERATING A SEMICONDUCTOR LASER

The invention is based on a priority application EP 03360020.6 which is hereby incorporated by reference.

BACKGROUND OF THE INVENTION

The present invention relates to a drive circuit for and a method of operating a semiconductor laser, in particular a vertical cavity surface-emitting laser (VCSEL).

The drive circuit according to the invention is, in particular, suitable for driving various types of VCSEL, i.e. VCSELs having different characteristics.

VCSELs are semiconductor laser diodes that emit their light vertically with respect to the surface of the wafer. They have many advantages compared with other semiconductor lasers. Mention may be made, for example, of the very high modulation rates, the very low power consumption, a high efficiency for optical coupling to optical fibres, and also photolithographically defined geometries. In addition, VCSELs are inexpensive. Compared with DFB lasers, the cost factor is, for example, approximately 100. However, VCSELs have a limited output power and a marked temperature dependence. Application fields for VCSELs are, for example, 10 Gbit Ethernet networks, in-office systems and also transmission systems in the short-link field, such as Metro networks. VCSELs having a laser wavelength in the region of 850 nm have been known for a fairly long time. Recently, VCSELs having a laser wavelength of 1300 nm have also been marketed. In contrast to DFB lasers, which are normally operated in the continuous-wave mode and whose laser light is modulated for information transmission via an external downstream modulator, VCSELs are modulated directly.

A circuit for driving a VCSEL having an emission wavelength of 850 nm is known that is a differential amplifier. In this instance, one terminal of the VCSEL is connected to ground or chassis respectively and the other terminal of the VCSEL to an output of the differential amplifier. Such a connection arrangement is also termed "single-ended". The VCSEL is operated with direct modulation by means of the differential amplifier. VCSELs having an emission wavelength of 850 nm have a relatively high threshold voltage of approximately 1.8 V, a threshold current of approximately 3 mA and a limit current of approximately 10 mA. Its differential resistance is in the order of magnitude of 60 Ω. To avoid distortions, the connecting line between the drive circuit and the VCSEL chip is normally matched to the differential resistance of the VCSEL.

The recently developed VCSELs having an emission wavelength of 1300 nm have a threshold voltage of 1.3 V but a differential resistance in the order of magnitude of 120 Ω. In contrast to connecting lines having an impedance of 120 Ω, the use of connecting lines having an impedance of 55-85 Ω does not present a problem from technical and economic points of view. The above-described drive circuit of the prior art has the disadvantage that, if in general only to a limited extent, it is usable for VCSELs having a high differential resistance.

SUMMARY OF THE INVENTION

On the other hand, the object of the invention is to create a circuit and a method for driving a semiconductor with which a semiconductor laser is driven with direct modulation at a high differential resistance.

The object of the invention is furthermore to create a circuit and a method that is also usable for driving semiconductor lasers having low differential resistance.

To achieve said object, on the one hand, a circuit for driving a semiconductor laser, in particular a vertical cavity surface-emitting laser, comprising a differential amplifier for driving the semiconductor laser directly, wherein a semiconductor laser to be connected to the circuit is differentially driven by means of the differential amplifier, a first output of the differential amplifier being direct-current-coupled to a first terminal of the semiconductor laser and a second output of the differential amplifier being alternating-current-coupled to a second terminal of the semiconductor laser and, on the other hand, a method of operating a circuit, wherein the circuit is matched to the semiconductor laser used under the control of specified events, wherein characteristic-curve data of the semiconductor laser are first measured by means of the circuit, at least one start-up value of the circuit is determined and set on the basis of the measured data and circuit operating values for operating the circuit comprising said semiconductor laser are determined and set by varying the start-up value at least as a function of a desired characteristic quantity of the semiconductor laser.

Further advantages and refinements of the invention emerge from the subclaims, from the description and the attached drawing.

It goes without saying that the above mentioned features and those still to be explained below are usable not only in the respectively specified combination, but also in other combinations or alone without departing from the scope of the present invention.

BRIEF DESCRIPTION OF THE DRAWINGS

The invention is presented on the basis of an exemplary embodiment in the drawings and is explained below with reference to the drawings.

FIG. 1 shows diagrammatically a drive circuit of the prior art for direct modulation of a semiconductor laser, in particular in the form of a semiconductor laser diode. Reference symbol 1 denotes a vertical cavity surface-emitting laser (VCSEL) whose cathode is connected to ground or chassis respectively, the VCSEL being modulated via the anode terminal. The circuit of the prior art is a known differential amplifier 10 that is connected upstream of the VCSEL 1 for the purpose of direct modulation. The differential amplifier 10 is a balanced direct-voltage amplifier having two inputs E1, E2 and two outputs A1, A2. The differential amplifier comprises two resistors 11, 12, two transistors 13, 14 and a constant-current source 15 that is disposed in the common emitter line of the transistors 13, 14. Differential amplifiers are generally known to the person skilled in the art and do not therefore require explanation in greater detail here. Owing to their low temperature drift, differential amplifiers are preferably also used if it is not a voltage difference, but only an input voltage that is to be amplified. In this case, one of the two inputs E1 or E2 is applied to chassis. In the circuit of FIG. 1, the input E1 is applied to chassis and the VCSEL 1 is driven via the input E2 and the output A1, which is connected to the anode of the VCSEL 1. The output A1 is not connected. As shown in FIG. 1, the VCSEL 1 is driven unilaterally via one terminal, namely the anode, whereas the cathode is connected to chassis. Such a connection arrangement is also termed "single-ended".

FIG. 2 shows a diagram of a first embodiment of a driver or drive circuit according to the invention for a VCSEL 1 in which the VCSEL 1 is differentially driven. In FIG. 2, the some reference symbols denote the same components as in FIG. 1. The circuit according to the invention is preferably designed as an integrated circuit (IC) or a part of an integrated circuit. The circuit according to the invention is described in greater detail below.

Figure 1:
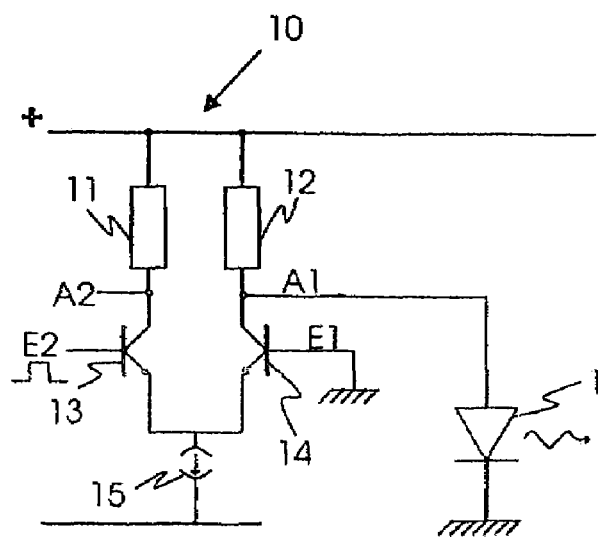
FIG. 1 shows a diagram of a circuit for driving a semiconductor laser of the prior art.
Figure 2:
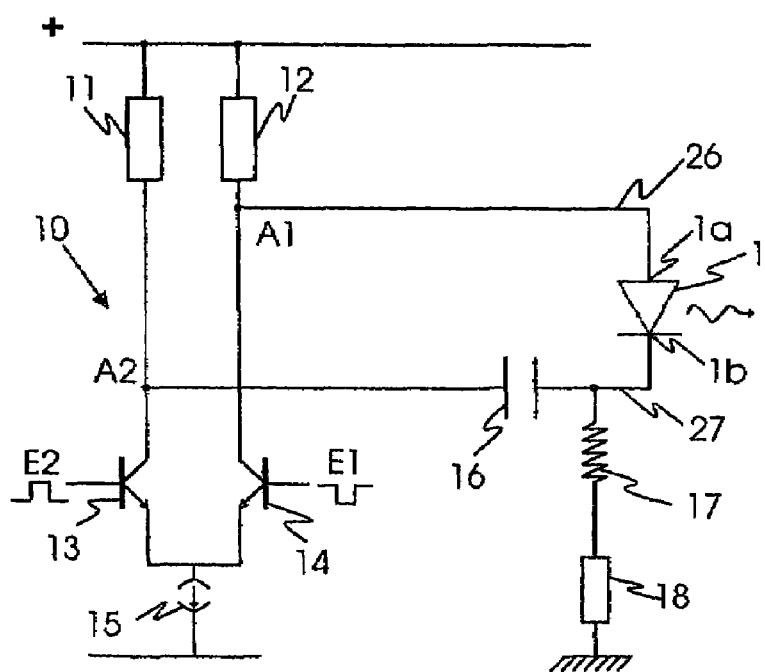
FIG. 2 shows a diagram of a first embodiment of a circuit according to the invention for driving a semiconductor laser.

The driver circuit according to the invention in FIG. 2 likewise comprises a differential amplifier 10, but both inputs E1 and E2 and both outputs A1 and A2 are used for differentially driving the VCSEL 1. The transistors 13, 14 are shown as bipolar transistors. It is obvious to the person skilled in the art that a differential amplifier comprising MOSFET transistors can also be used. The output A2 is connected to the anode 1a of the VCSEL 1 and the output A1 is connected via a capacitor 16 to the cathode 1b of the VCSEL 1. Between the capacitor 16 and the cathode 1b of the VCSEL 1, a coil 17 and a resistor 18 are additionally connected to ground in series as a direct-current path. The VCSEL 1 is driven differentially, i.e. the resistors 11, 12 and the current source 15 are specified in such a way that a voltage difference of approximately 1.5 V drops across the VCSEL 1 and modulation frequencies are applied via the inputs E1 and E2. The cathode of the VCSEL 1 is alternating-current-coupled (AC-coupled) via the capacitor 16 to the output A2 of the differential amplifier 10. The circuit branch comprising output A1 of the differential amplifier 10, anode 1a and cathode 1b, respectively, of the VCSEL 1 is direct-current-coupled (DC-coupled) via the coil 17 and the resistor 18. The bias for driving the VCSEL 10 is applied via this branch. The VCSEL 1 is connected to the circuit via impedance-matched terminal lines 26 and 27.

The drive circuit according to the invention is particularly advantageous for driving a VCSEL having high differential resistance.

The VCSELs already used for a fairly long time in practice and having an emission wavelength of 850 nm have a relatively high threshold voltage of approximately 1.8 V, a threshold current of approximately 3 mA and a limit current of approximately 10 mA. Their differential resistance is in the order of magnitude of 60 Ω. Owing to the marked temperature dependence of VCSELs, an effort is made to dispose the integrated circuit comprising the drive circuit and the chip comprising the VCSEL with a spatial separation. The spacings are normally in the centimetre range. To avoid distortions, the connecting line of the drive circuit to the VCSEL chip is normally designed in such a way that the characteristic wave impedance is terminated, i.e. it is matched to the differential resistance of the VCSEL. Connecting lines having an impedance of 55 to 85 Ω are implementable and available from economic points of view at reasonable cost.

The VCSELs recently developed and having an emission wavelength of 1300 nm have a threshold voltage of 1.3 V, but a differential resistance in the order of magnitude of 120 Ω. Connecting lines having an impedance of 120 Ω are technically expensive to produce and handle and are, consequently, not inexpensive.

As a result of the drive circuit according to the invention having differential drive, the characteristic wave impedance of the drive/connecting lines can easily be terminated even for VCSELs having high differential resistance. As a result of the two connecting lines, a termination using simple technical means can also be achieved in this case as a consequence of the differential drive, i.e. the available lines having a line impedance in the range from 50 to 85 Ω can be used.

The circuit according to the invention in FIG. 2 has, in addition, the advantage that, as a result of the chosen circuit arrangement—namely the use of a direct-current-coupled branch and an alternating-current-coupled branch for connecting to the VCSEL—the capacitor 16, the coil 17 and the resistor 18, which are also described as a bias-T, are dimensioned in such a way that they can be integrated into the IC that comprises the drive circuit. In terms of order of magnitude, the capacitor 16 has a value of 2 pF, the coil 17 has a value of 4.7 nH and the resistor has a value of 50 Ω. This is an appreciable advantage for the manufacture and the operation of the circuit. The circuit according to the invention consequently has the advantage that the VCSEL is operated differentially only in the "high-frequency" range, whereas the VCSEL is driven "quasi single-ended" in the direct-current range to apply the bias.

The circuit according to the invention furthermore has the advantage that it is also usable for the known VCSELs having fairly low differential resistance.

In other words: the circuit or is suitable not only for driving a VCSEL having a fairly high differential resistance, that is to say, for example, a VCSEL having an emission wavelength of 1300 nm and a differential resistance of approximately 120 Ω as described previously, but can also easily be used for the VCSELs already known for a fairly long time having an emission wavelength of 850 nm and having a fairly low resistance of approximately 60 Ω. To drive an 850 nm VCSEL, one input, that is to say E1 or E2, is simply applied to a constant potential and the cathode of the VCSEL is not connected to the output A2 via the capacitor 16, but simply applied to chassis, thereby achieving a "single-ended" drive of the VCSEL.

Figure 3:
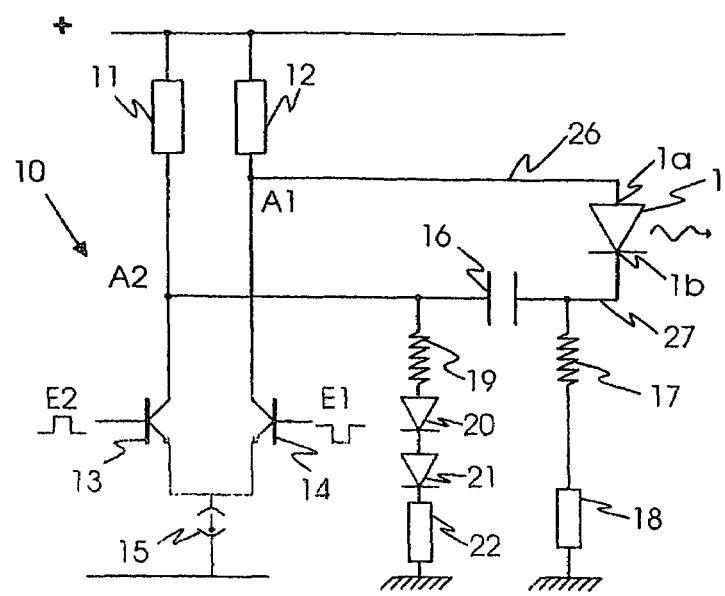
FIG. 3 shows a diagram of a second embodiment of the circuit according to the invention for driving a semiconductor laser and FIG. 4 shows a diagram of a third embodiment of the circuit according to the invention for driving a semiconductor laser.

FIG. 3 shows an advantageous refinement of the circuit according to the invention in FIG. 2. For balance reasons, between the output A2 and the capacitor 16, a coil 19 and two diodes 20, 21 are connected in series to ground via a resistor 22. This achieves the result that the working points are the same on both sides, thereby avoiding distortions.

Figure 4:
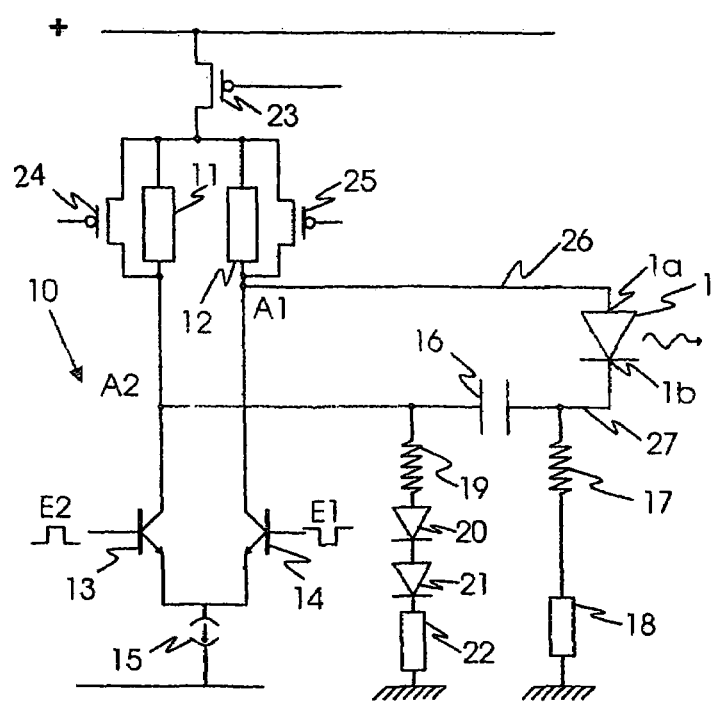

FIG. 4 shows a further advantageous refinement of the driver circuit according to the invention in FIG. 3. A transistor 23 is connected upstream of the parallel connected resistors 11 and 12 in the collector branch of the transistors 13 and 14. In addition, a further transistor 24 and 25 is connected in parallel with each resistor 11 and 12. The transistors 23, 24 and 25 shown in FIG. 4 are MOSFET transistors. The connection arrangement shown for the resistors advantageously makes possible a variable setting of the working point of the differential amplifier 10 if suitable voltages are applied to the gates of the transistors 23, 24 and 25.

A driver circuit according to the invention designed in this way is suitable, in particular, for an automatic setting or adjustment of the drive circuit to the respectively used VCSEL 1. Said adjustment may take place in regard to very varied factors and may be desirable, for example, for the use of the circuit comprising VCSELs that emit laser light at different wavelengths. The characteristics or characteristic curves normally differ in this connection markedly from one another so that considerable matching is required in this case. However, the adjustment may be performed, in particular, also in regard to the use of the circuit in the "single-ended" operating mode or the differential operating mode or "dual-ended" operating mode. The automatic matching/adjustment of the circuit may furthermore also be provided for absorbing less significant deviations, for example if VCSELs of identical or similar construction from different manufacturers are used, or for compensating for production tolerances of a certain VCSEL. Finally, the automatic adjustment may also serve for matching to different environmental effects during the operation of the VCSEL, for example temperature effects. Depending on the desired purpose of use, an appropriately large adjustment range and an appropriate adjustment precision should consequently be provided.

In a further preferred refinement of the invention, digital-to-analogue converters are provided at least for the inputs E1, E2 of the differential amplifier 10 and of the control input of the constant-current source 15 (not shown). In this way, adjustments/matchings of the circuit or the drive of the semiconductor laser can be performed by means of a program executed on a microprocessor. The microprocessor together with the input/output chips and memory (RAM, ROM, etc.) may be provided externally or be on the IC of the drive circuit. In a preferred development of the circuit, it comprises at least the microprocessor (not shown) for performing a program for driving the semiconductor laser and/or adjustment of the circuit.

The method according to the invention for operating the drive circuit in which the circuit is matched to the respectively used semiconductor laser is described below.

The matching of the circuit is initiated by specified events. Specified events are, for example, an initial start-up or a repeat start-up, a replacement of the semiconductor loser, a specified number of operating hours or an occurrence of a fault.

In accordance with the method
charazcteristic-curve data of the semiconductor lasers are first measured by means of the circuit,
at least one start-up value of the circuit is determined and set on the basis of the measured data and
circuit operating values for operating the circuit comprising said semiconductor laser are determined and set by varying the start-up value at least as a function of the desired characteristic quantity, for example the emission rate, of the semiconductor laser.

The method of automatically matching the drive circuit to the respectively connected VCSEL is described more precisely below. By way of example, the control current is provided as the start-up value or parameter for setting the circuit. However, other characteristic quantities, for example voltage, temperature, etc. may be used instead or additionally for the setting. Preferably, the circuit is calibrated during start-up or the characteristic curve of the VCSEL is measured, and the circuit is set on the basis of the measured data obtained. For this purpose, the circuit is connected to the previously described microprocessor (not shown), which executes a program for determining the characteristics of the VCSEL. The microprocessor is connected via appropriate input/output chips and digital-to-analogue converters to the inputs E1, E2 of the transistors 13 and 14, to a control input of the constant-current source 15 and the gate inputs of the transistors 23, 24 and 25. The output of a monitor diode, which is normally available on a semiconductor laser, for example VCSEL, is made available to the microprocessor for evaluation via an analogue-to-digital converter. Appropriate sensors and interfaces may be provided to determine further characteristic data, for example the temperature.

To set/match the circuit, the characteristic curve of the VCSEL is preferably measured first. This is done using the drive circuit and, to be precise, by setting suitable current/voltage values in steps, in which case equidistant steps or even variable step widths may be provided depending on characteristic-curve range. The characteristic curves determined may be stored, for example for later evaluation, for documenting, etc. The maximum control current is then set and the emission rate is measured by means of the monitor diode. The maximum control current is then lowered in steps and the current for the desired emission rate is determined during this operation using the monitor diode. The working point determined in this way is stored and the circuit is aligned to this setting. Depending on the respective requirements (tolerance values, etc.), the characteristic curves for certain semiconductor lasers may already be stored in a memory, with the result that determination of the characteristic curve may be dispensed with.

The adjustment of the driver circuit may, in addition, be controlled by different events, for example, the initial start-up, the replacement of a semiconductor laser, for example a VCSEL, the number of operating hours, the occurrence of a fault, etc. In addition, certain configurations of the driver/drive circuit may be stored in the memory for certain types of semiconductor lasers and/or operating modes (dual-ended, single-ended). Depending on the requirement, no fine adjustment or a fine adjustment only to be performed rapidly is necessary. In addition, provision may be made for the operation of the semiconductor laser to be monitored continuously and/or measured data of the semiconductor laser to be evaluated at short time intervals in order to ensure in this way a largely optimized operation of the semiconductor laser.

The invention claimed is:

1. A circuit for driving a semiconductor laser, in particular a vertical cavity surface-emitting laser, comprising a differential amplifier for driving the semiconductor laser directly, wherein
    a semiconductor laser to be connected to the circuit is differentially driven by means of the differential amplifier,
    a first output of the differential amplifier being direct-current-coupled to a first terminal of the semiconductor laser and
    a second output of the differential amplifier being alternating-current-coupled to a second terminal of the semiconductor laser.

2. A circuit according to claim 1, wherein the second output of the differential amplifier is connected to the second terminal of the semiconductor laser by means of a capacitor, a coil and a resistor being connected in series to ground between the capacitor and the second terminal.

3. A circuit according to claim 2, wherein a series connection of a further coil, two diodes and a further resistor connected to ground is provided between the second output of the differential amplifier and the capacitor.

4. A circuit according to claim 1, wherein variable resistors are connected in parallel with the resistors of the differential amplifier.

5. A circuit according to claim 1, wherein digital-to-analogue converters are provided at least for the inputs of the differential amplifier and of a control input of the constant-current source.

6. A circuit according to claim 5, wherein the circuit comprises a microprocessor for executing a program for driving the semiconductor laser and/or setting the circuit.

7. A circuit according to claim 1, wherein the circuit comprises the semiconductor laser, which is, in particular, a semiconductor diode, the anode of the laser diode being the first terminal of the semiconductor laser and the cathode of the laser diode being the second terminal of the semiconductor laser.

8. A circuit according to claim 7, wherein the circuit and the semiconductor laser are disposed on spatially separated integrated circuits, impedance-matched lines of the circuit being provided for connecting the semiconductor laser to the circuit.

9. A method of operating a circuit according to claim 1, wherein the circuit is matched to the semiconductor laser used under the control of specified events,
- wherein characteristic-curve data of the semiconductor laser are first measured by means of the circuit,
- at least one staff-up value of the circuit is determined and set on the basis of the measured data and
- circuit operating values for operating the circuit comprising said semiconductor laser are determined and set by varying the staff-up value at least as a function of a desired characteristic quantity of the semiconductor laser.

10. A method according to claim 9, wherein at least an initial or repeat staff-up, a replacement of the semiconductor laser, a specified number of operating hours or an occurrence of a fault is an event in the context of the specified events.

11. A circuit for driving a semiconductor laser, in particular a vertical cavity surface emitting laser, said circuit comprising a differential amplifier for driving the semiconductor laser either directly or in differential mode, said differential amplifier including a first output terminal direct-current (DC) coupled to a first terminal of the semiconductor laser and a second output terminal alternating-current (AC) coupled to a second terminal of the semiconductor laser, whereby said semiconductor laser is differentially driven when an output signal of said differential amplifier across said first and second outputs terminals is an AC signal and is driven in a single-ended mode when said output signal is a DC signal.

* * * * *